United States Patent
Xu et al.

(10) Patent No.: US 9,842,743 B1
(45) Date of Patent: Dec. 12, 2017

(54) METHOD OF ETCHING A SHALLOW TRENCH

(71) Applicant: SHANGHAI HUALI MICROELECTRONICS CORPORATION, Shanghai (CN)

(72) Inventors: Jin Xu, Shanghai (CN); Zaifeng Tang, Shanghai (CN); Minjie Chen, Shanghai (CN); Yu Ren, Shanghai (CN); Yukun Lv, Shanghai (CN)

(73) Assignee: SHANGHAI HUALI MICROELECTRONICS CORPORATION, Shanghai (CN)

( * ) Notice: Subject to any disclaimer, the term of this patent is extended or adjusted under 35 U.S.C. 154(b) by 0 days.

(21) Appl. No.: 15/389,414

(22) Filed: Dec. 22, 2016

(30) Foreign Application Priority Data

Nov. 30, 2016 (CN) .......................... 2016 1 1076529

(51) Int. Cl.
*H01L 21/302* (2006.01)
*H01L 21/3065* (2006.01)
*H01L 21/67* (2006.01)
*H01L 21/311* (2006.01)
*H01L 21/308* (2006.01)

(52) U.S. Cl.
CPC ...... *H01L 21/3065* (2013.01); *H01L 21/3081* (2013.01); *H01L 21/3083* (2013.01); *H01L 21/31116* (2013.01); *H01L 21/31144* (2013.01); *H01L 21/67069* (2013.01)

(58) Field of Classification Search
None
See application file for complete search history.

(56) References Cited

U.S. PATENT DOCUMENTS

| | | | |
|---|---|---|---|
| 9,105,697 B2 * | 8/2015 | Chiu | H01L 21/76877 |
| 2003/0232505 A1 * | 12/2003 | Lazar | H01L 21/0332 438/714 |
| 2006/0292883 A1 * | 12/2006 | Tsai | H01L 21/31116 438/710 |
| 2007/0010099 A1 * | 1/2007 | Du | H01J 37/321 438/706 |

* cited by examiner

*Primary Examiner* — Alexander Ghyka
(74) *Attorney, Agent, or Firm* — Tianchen LLC

(57) ABSTRACT

A method of etching a shallow trench is disclosed in the present invention. By removing the photoresist layer immediately at the end point of the hard mask layer etching and further using the improved process conditions etch the top of the substrate at the same time of the hard mask layer over-etching, such as a lower bias power, a higher pressure and a bigger polymer gases flow rate, the present invention has formed a smooth morphology on the top of the shallow trench. Therefore, the sharp corner appeared in the prior art is avoided by changing the start point of the silicon substrate etching, so as to fundamentally eliminate the leakage current caused by the sharp corner.

9 Claims, 4 Drawing Sheets

METHOD OF ETCHING A SHALLOW TRENCH

CROSS-REFERENCE TO RELATED APPLICATION

This application claims the priority benefit of China patent application serial No. 201611076529.7, filed Nov. 30, 2016. The entire contents of the above-mentioned patent application are hereby incorporated by reference herein and made a part of the specifications.

FIELD OF THE INVENTION

The present invention relates to the field of microelectronics, and particularly to a method of etching a shallow trench on the power consumption products for optimizing leakage currents.

BACKGROUND OF THE INVENTION

Following the Moore's law, the key size of semiconductor device trend to be smaller. However, the leakage current is gradually increased, seriously affecting the electrical properties and the reliability of the device. For example, as line width of a gate becomes smaller, the leakage current between the source/drain/gate/silicon substrate of the CMOS device is gradually increasing. At present, there is still a lack of effective means to reduce the leakage current in the manufacturing process of a conventional CMOS semiconductor device.

Referring to FIGS. 1-7, which are schematic views illustrating a shallow trench etching process using a hard mask in the prior art. As shown in the FIGS. 1-7, a shallow trench etching process in the prior art, comprising the steps of:

1) forming a pad oxide layer 11, a silicon nitride hard mask layer 12, a BARC layer 13, and a photoresist layer 14 on a substrate 10 in turn, patterning the photoresist layer 14, and then etching the BARC layer 13 by using the patterned photoresist layer 14 as a mask, as shown in the FIG. 1;

2) etching the silicon nitride hard mask layer 12, as shown in the FIG. 2;

3) over etching the silicon nitride hard mask layer 12, as shown in the FIG. 3;

4) removing the photoresist layer 14, as shown in the FIG. 4;

5) removing the oxide generated when the photoresist layer is removed, as shown in the FIG. 5;

6) smoothly etching the top 15 of the shallow trench, as shown in the FIG. 6;

7) etching the shallow trench 18, as shown in the FIG. 7.

In the above mentioned shallow trench etching process, the removal of silicon nitride in the over-etching step (step 3) also causes the top of the silicon substrate to be etched to form a recess 15, resulting in a partial loss of silicon. In addition, the conditions commonly used in this step, such as high bias power and low etching gases, trend to the formation of a sharp corner 16 in the bottom of the recess 15. However, the presence of the sharp corner 16 will result in a significant increase in leakage current. And once the sharp corner 16 is formed, the sharp corner 16 cannot be completely eliminated even if the bottom of the recess 15 is smoothly etched (step 6), as shown in the FIGS. 6-7.

Therefore, it is necessary to provide a novel method of shallow trench etching to reduce the leakage current.

BRIEF SUMMARY OF THE DISCLOSURE

To overcome the problems as mentioned above, it is an object of the present invention to provide a novel method of shallow trench etching.

To achieve above object, technical solutions of the present invention are as follows:

A method of etching a shallow trench, comprising the steps of:

Step S01: providing a substrate, and forming a pad oxide layer, a hard mask layer and a photoresist layer on the substrate at least in turn;

Step S02: etching the hard mask layer by using a patterned photoresist layer as a mask at the conditions of a first pressure, a first bias power and a first etching gases flow rate, wherein, the first pressure is lower than the lower limit of a reference pressure, the first bias power is higher than the upper limit of a reference bias power, the first etching gases flow rate is smaller than the lower limit of a reference etching gases flow rate;

Step S03: removing the photoresist layer;

Step S04: over etching the hard mask layer by using a patterned hard mask layer as a mask until the pad oxide layer is completely etched at the conditions of a second pressure, a second bias power and a second etching gases flow rate, wherein, the second pressure is higher than the upper limit of the reference pressure, the second bias power is lower than the lower limit of the reference bias power, the second etching gases flow rate is bigger than the upper limit of the reference etching gases flow rate;

Step S05: etching the top of the substrate to form a recess having a smooth sidewall at the conditions of a third pressure, a third bias power and a third etching flow rate, wherein, the third pressure is higher than the upper limit of the reference pressure, the third bias power is lower than the lower limit of the reference bias power, the third etching gases flow rate is bigger than the upper limit of the reference etching gases flow rate;

Step S06: forming a shallow trench;

wherein, the reference pressure is 15-30 mtorr, the voltage of the reference bias power is 100-500V, the reference etching gases flow rate is 50-100 sccm.

Preferably, in the Step S03 and the Step S04, the interface between the hard mask layer and the pad oxide layer is used as an end point of the hard mask layer etching, and the removal of the photoresist layer is immediately performed after etching the hard mask layer.

Preferably, in the Step S03, the photoresist layer is removed in-situ in a same etch chamber.

Preferably, an ashing process containing oxygen is used to remove the photoresist layer.

Preferably, in the Step S04, the interface between the pad oxide layer and the substrate is used as an end point of the hard mask layer over etching.

Preferably, the first pressure is lower than 15 mtorr, the voltage of the first bias power is higher than 500V, the first etching a gases flow rate is smaller than 50 sccm; the second pressure and the third pressure are higher than 30 mtorr, the voltages of the second bias power and the third bias power are lower than 100V, the second etching gases flow rate and the third etching gases flow rate are bigger than 100 sccm.

Preferably, the substrate is a silicon material, and the hard mask layer is a silicon nitride material.

Preferably, in the Step S02, the etching gases used to etch the hard mask layer include $CHF_3$; in the Step S04, the etching gases used to over etch the hard mask layer include CHF$_3$ and CH$_2$F$_2$; in the Step S05, the etching gases used to etch the top of the substrate include CH$_3$F.

Concluded from the above solutions that, by removing the photoresist layer immediately at the end point of the hard mask layer etching and further using the improved process conditions etch the top of the substrate at the same time of the hard mask layer over-etching, such as a lower bias power, a higher pressure and a bigger etching gases flow rate, the present invention has formed a smooth morphology on the top of the shallow trench. Therefore, the sharp corner appeared in the prior art is avoided by changing the start point of the silicon substrate etching, so as to fundamentally eliminate the leakage current caused by the sharp corner.

DETAILED DESCRIPTION OF THE EMBODIMENTS

Figure 1:
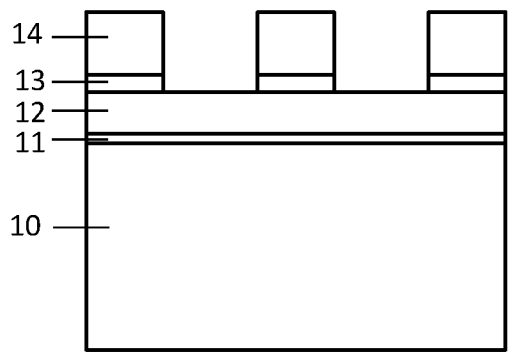
FIGS. 1-7 are schematic views illustrating a shallow trench etching process using a hard mask in the prior art.
Figure 2:
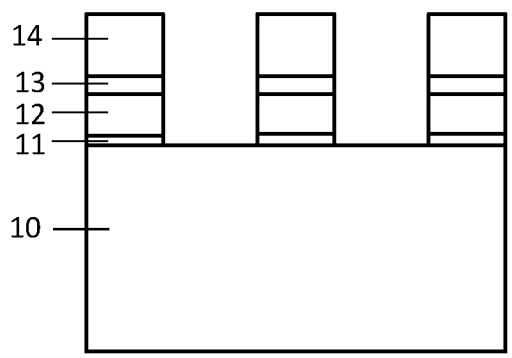
Figure 3:
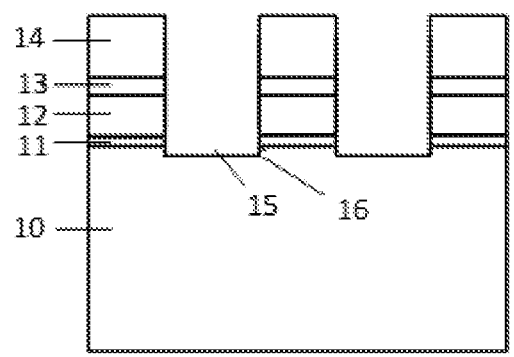
Figure 4:
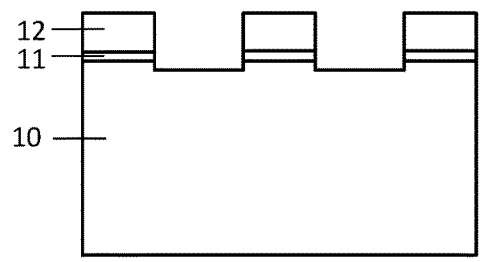
Figure 5:
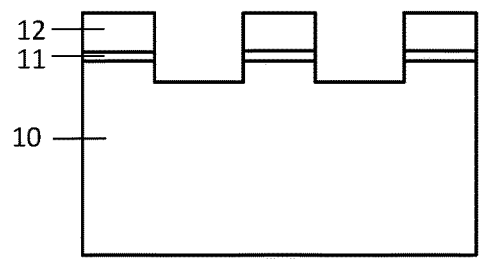
Figure 6:
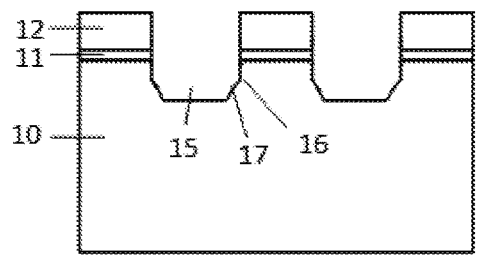
Figure 7:
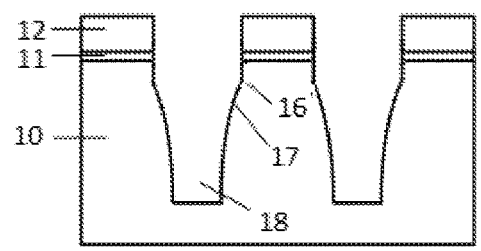

The present invention will be described in further details hereinafter by referring to the accompanying drawings, so as to provide a better understanding of the present invention.

It should be noted that, in the following specific embodiments, when these embodiments of the present invention are described in detail, in order to clearly illustrate the structure of the present invention to facilitate explanation, the accompanying drawings are not necessarily drawn to scale, some features in the drawings may have been fragmentary enlarged, deformed or simplified. Therefore, it should be avoided to understand this as a limitation to the present invention.

Figure 8:
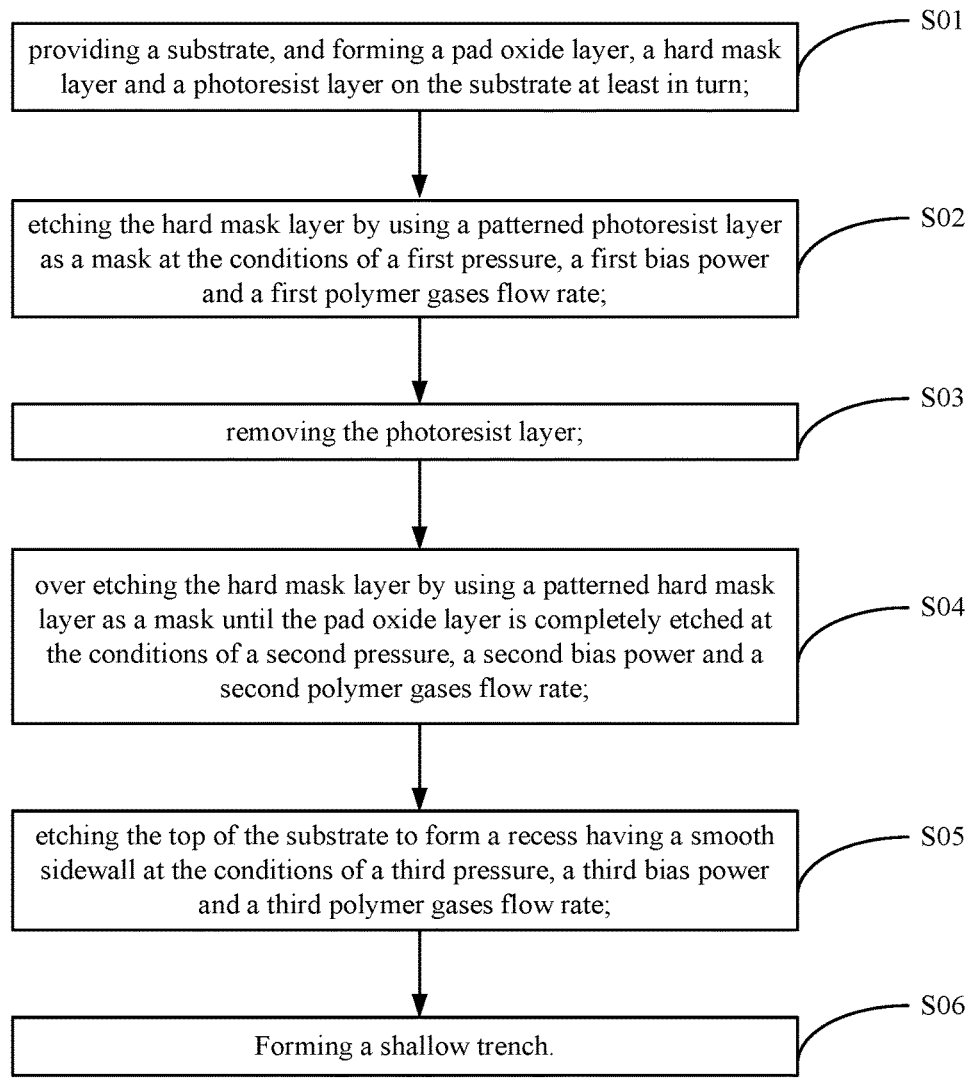
FIG. 8 is a flow sheet illustrating a method of etching a shallow trench in the present invention.

Referring to FIG. 8, which is a flow sheet illustrating a method of etching a shallow trench in the present invention. Meanwhile, referring to FIGS. 9-13, which are schematic views illustrating etching steps of a shallow trench according to a preferred embodiment of the present invention. As shown in the FIG. 8, the present invention provides a method of etching a shallow trench, which comprising the steps of:

Step S01: providing a substrate, and forming a pad oxide layer, a hard mask layer and a photoresist layer on the substrate at least in turn.

Figure 9:
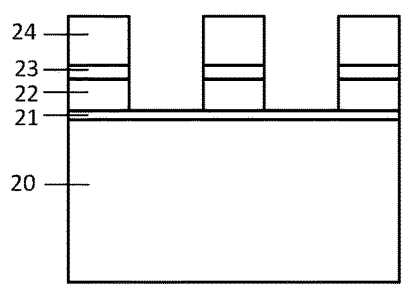
FIGS. 9-13 are schematic views illustrating etching steps of a shallow trench according to a preferred embodiment of the present invention.

Referring to FIG. 9. The substrate may be a silicon substrate 20 in the embodiment. Firstly, forming a SiO$_2$ pad oxide layer 21, a hard mask layer 22, a BARC (bottom anti reflective coating) layer 23 and a photoresist layer 24 on the silicon substrate 20 in turn. Wherein, the hard mask layer 22 may be made of a silicon nitride material. Of course, other suitable materials may also be used, and the present invention is not limited thereto. Then, patterning the photoresist layer 24 by using a photolithographic process.

Step S02: etching the hard mask layer by using a patterned photoresist layer as a mask at the conditions of a first pressure, a first bias power and a first etching gases flow rate, wherein, the first pressure is lower than the lower limit of a reference pressure, the first bias power is higher than the upper limit of a reference bias power, the first etching gases flow rate is smaller than the lower limit of a reference etching gases flow rate.

Referring to FIG. 9, again. In this step, the usual etching conditions for the hard mask layer 22 in the prior art are set as reference conditions, for example, a reference pressure is 15-30 mtorr, the voltage of a reference bias power is 100-500V, a reference etching gases flow rate is 50-100 sccm, and the main etching gases include CHF$_3$. Therefore, the first pressure is lower than 15 mtorr, the voltage of the first bias power is higher than 500V, and the first etching gases flow rate is smaller than 50 sccm. The etching gases used in this step include CHF$_3$.

Compared to the reference conditions, the present invention can accelerate the etch rate of the hard mask layer 22 and avoid undesirable morphology by employing improved techniques such as reducing the pressure, increasing the bias power, and decreasing the etching gas flow rate. Therefore, the accuracy and the good morphology of subsequent etching are further ensured.

In this step, it is necessary to control the switching point of going on the next step to avoid a loss of the silicon substrate 20. The interface between the silicon nitride hard mask layer 22 and the pad oxide layer 21 is used as an end point of the hard mask layer 22 etching. A silicon nitride endpoint detection system is used to determine the end point of the hard mask etching. Therefore, the end point of the hard mask 22 etching is ensured to stop on the pad oxide layer 21 to avoid a loss of the silicon substrate 20.

Step S03: removing the photoresist layer.

Figure 10:
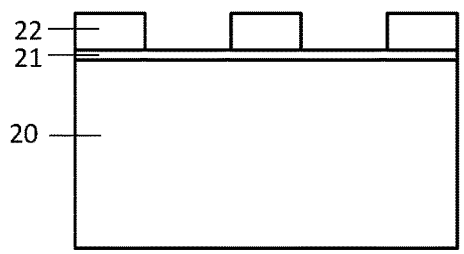

Referring to FIG. 10. The removal of the photoresist layer 24 is immediately performed when reaches the end point of the hard mask layer 22 etching. As a preferred embodiment, the photoresist layer 24 is removed in-situ in a same etch chamber as the hard mask layer 22 etching, and an ashing process containing oxygen is used to remove the photoresist layer 24. Therefore, the silicon nitride hard mask layer 22 may be used as a mask to go on the next process.

Step S04: over etching the hard mask layer by using a patterned hard mask layer as a mask until the pad oxide layer is completely etched at the conditions of a second pressure, a second bias power and a second etching gases flow rate, wherein, the second pressure is higher than the upper limit of the reference pressure, the second bias power is lower than the lower limit of the reference bias power, the second etching gases flow rate is bigger than the upper limit of the reference etching gases flow rate.

Figure 11:
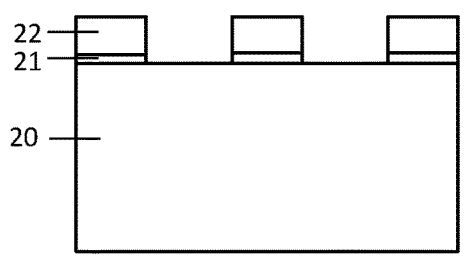

Referring to FIG. 11. In this step, the second pressure is higher than 30 mtorr, the voltages of the second bias power is lower than 100V, and the second etching gases flow rate is bigger than 100 sccm. The second etching gases include CHF$_3$ and CH$_2$F$_2$.

Compared to the reference conditions, the present invention can slow down the longitudinal etch rate of the hard mask layer 22 over etching and control the end point of etching by employing improved techniques such as increasing the pressure, reducing the bias power, and enhancing the etching gas flow rate. Therefore, it is favorable for the formation of the smooth morphology on the top of the silicon substrate 20.

In this step, it is necessary to control the switching point of going on the next step to avoid excessive lateral etching. The interface between the pad oxide layer 21 and the silicon substrate 20 is used as an end point of the hard mask layer 22 over etching. A silicon nitride endpoint detection system is used to determine the end point of the hard mask over etching. Therefore, the sharp corners appeared in the prior art are avoided.

Step S05: etching the top of the silicon substrate 20 to form a recess having a smooth sidewall at the conditions of a third pressure, a third bias power and a third etching gases flow rate, wherein, the third pressure is higher than the upper limit of the reference pressure, the third bias power is lower than the lower limit of the reference bias power, the third etching gases flow rate is bigger than the upper limit of the reference etching gases flow rate.

Figure 12:
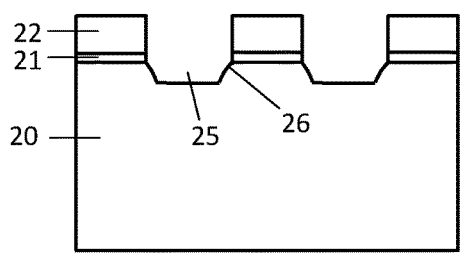

Referring to FIG. 12. In this step, the same process conditions as used in the Step S04 is employed to etch the top of the substrate 20 to form a recess 25 having a smooth sidewall 26, i.e., the third pressure is higher than 30 mtorr, the voltages of the third bias power is lower than 100V, and the third etching flow rate is bigger than 100 sccm. The etching gases used in this step include $CH_3F$.

Compared to the reference conditions, the present invention can slow down the longitudinal etch rate and reduce the amount of lateral etching by employing improved techniques such as increasing the pressure, reducing the bias power, and enhancing the etching gas flow rate. Therefore, it is favorable for the formation of the smooth sidewall 26. In addition, the longitudinal etch rate can be further slowed down by further increasing the third etching gases flow rate, such as bigger than 200 sccm, so that the curvature radius of the smooth sidewall 26 is greatly enlarged to minimize the leakage current.

Step S06: forming a shallow trench.

Figure 13:
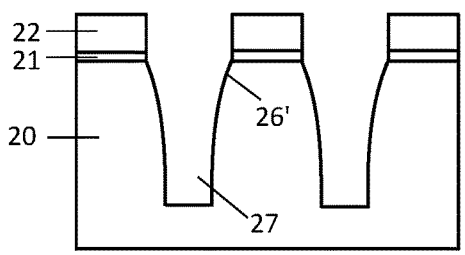

Referring to FIG. 13. The reference conditions of the prior art is employed to go on etching a shallow trench. Therefore, the smooth sidewall 26 on the top of the shallow trench 27 is formed.

It is found through experiments that, by the smooth etching (Step S05) after changing the start point of the silicon substrate 20 etching, the present invention have allowed a substantial increase in the curvature radius of the smooth sidewall 26 by about six times (from 4.9 nm to 34.1 nm), while the corresponding leakage current decreases about 70%. Thereby, the device power consumption is effectively reduced and the life of electronic products is extended.

The above-mentioned method of the present invention is suitable for the improvement of the leakage current due to the poor morphology of the shallow trench during the in-line slice detection, and also suitable for the improvement of the leakage current due to the poor morphology of the shallow trench during the macroscopic detection.

In summary, by removing the photoresist layer immediately at the end point of the hard mask layer etching and further using the improved process conditions etch the top of the substrate 20 at the same time of the hard mask layer over-etching, such as a lower bias power, a higher pressure and a bigger etching gases flow rate, the present invention has formed a smooth morphology on the top of the shallow trench. Therefore, the sharp corner appeared in the prior art is avoided by changing the start point of the silicon substrate 20 etching, so as to fundamentally eliminate the leakage current caused by the sharp corner.

Although the present invention has been disclosed as above with respect to the preferred embodiments, they should not be construed as limitations to the present invention. Various modifications and variations can be made by the ordinary skilled in the art without departing the spirit and scope of the present invention. Therefore, the protection scope of the present invention should be defined by the appended claims.

The invention claimed is:

1. A method of etching a shallow trench, comprising the steps of:

Step S01: providing a substrate, and forming a pad oxide layer, a hard mask layer and a photoresist layer on the substrate at least in turn;

Step S02: etching the hard mask layer by using a patterned photoresist layer as a mask at the conditions of a first pressure, a first bias power and a first etching gases flow rate; wherein, the first pressure is lower than the lower limit of a reference pressure, the first bias power is higher than the upper limit of a reference bias power, the first etching gases flow rate is smaller than the lower limit of a reference etching gases flow rate; wherein the etching gases used to etch the hard mask layer include $CHF_3$ Step S03: removing the photoresist layer;

Step S04: over etching the hard mask layer by using a patterned hard mask layer as a mask until the pad oxide layer is completely etched at the conditions of a second pressure, a second bias power and a second etching gases flow rate; wherein, the second pressure is higher than the upper limit of the reference pressure, the second bias power is lower than the lower limit of the reference bias power, the second etching gases flow rate is bigger than the upper limit of the reference etching gases flow rate; wherein the etching gases used to over etch the hard mask layer include $CHF_3$ and $CH_2F_2$ Step S05: etching the top of the substrate to form a recess having a smooth sidewall at the conditions of a third pressure, a third bias power and a third etching gases flow rate; wherein, the third pressure is higher than the upper limit of the reference pressure, the third bias power is lower than the lower limit of the reference bias power, the third etching gases flow rate is bigger than the upper limit of the reference etching gases flow rate; wherein the etching gases used to etch the top of the substrate include $CH_3F$;

Step S06: forming a shallow trench;

wherein, the reference pressure is 15-30 mtorr, the voltage of the reference bias power is 100-500V, the reference etching gases flow rate is 50-100 sccm.

2. The method according to claim 1, wherein, in the Step S03 and the Step S04, the interface between the hard mask layer and the pad oxide layer is used as an end point of the hard mask layer etching, and the removal of the photoresist layer is immediately performed after etching the hard mask layer.

3. The method according to claim 1, wherein, in the Step S03, the photoresist layer is removed in-situ in a same etch chamber.

4. The method according to claim 2, wherein, in the Step S03, the photoresist layer is removed in-situ in a same etch chamber.

5. The method according to claim 3, wherein an ashing process containing oxygen is used to remove the photoresist layer.

6. The method according to claim 4, wherein an ashing process containing oxygen is used to remove the photoresist layer.

7. The method according to claim 1, wherein, in the Step S04, the interface between the pad oxide layer and the substrate is used as an end point of the hard mask layer over etching.

8. The method according to claim 1, wherein the first pressure is lower than 15 mtorr, the voltage of the first bias power is higher than 500V, the first etching gases flow rate is smaller than 50 sccm; the second pressure and the third pressure are higher than 30 mtorr, the voltages of the second bias power and the third bias power are lower than 100V, the second etching gases flow rate and the third etching gases flow rate are bigger than 100 sccm.

9. The method according to claim 1, wherein the substrate is a silicon material, and the hard mask layer is a silicon nitride material.

* * * * *